(12) United States Patent
Yu et al.

(10) Patent No.: US 10,505,041 B2
(45) Date of Patent: Dec. 10, 2019

(54) SEMICONDUCTOR DEVICE HAVING EPITAXIAL LAYER WITH PLANAR SURFACE AND PROTRUSIONS

(71) Applicant: UNITED MICROELECTRONICS CORP., Hsin-Chu (TW)

(72) Inventors: Chun-Wei Yu, Tainan (TW); Hsu Ting, Tainan (TW); Chueh-Yang Liu, Tainan (TW); Yu-Ren Wang, Tainan (TW); Kuang-Hsiu Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 210 days.

(21) Appl. No.: 15/469,569

(22) Filed: Mar. 26, 2017

(65) Prior Publication Data

US 2017/0200824 A1 Jul. 13, 2017

Related U.S. Application Data (62) Division of application No. 15/003,782, filed on Jan. 21, 2016, now Pat. No. 9,646,889.

(30) Foreign Application Priority Data

Dec. 25, 2015 (CN) .......................... 2015 1 0995716

(51) Int. Cl.
*H01L 29/78* (2006.01)
*H01L 21/8238* (2006.01)
(Continued)

(52) U.S. Cl.
CPC .... *H01L 29/7845* (2013.01); *H01L 21/02065* (2013.01); *H01L 21/28123* (2013.01); *H01L 21/823814* (2013.01); *H01L 21/823828* (2013.01); *H01L 21/823864* (2013.01); *H01L 21/823871* (2013.01); *H01L 23/535* (2013.01); *H01L 27/092* (2013.01); *H01L 29/165* (2013.01); *H01L 29/41766* (2013.01); *H01L 29/45* (2013.01); *H01L 29/66545* (2013.01);
(Continued)

(58) Field of Classification Search
CPC .................................................... H01L 29/7848
See application file for complete search history.

(56) References Cited

U.S. PATENT DOCUMENTS 8,883,033 B2 11/2014 Chen et al.
9,054,187 B2 6/2015 Liu et al.
(Continued)

OTHER PUBLICATIONS

Hung, Title of Invention: Semiconductor Structure and Manufacturing Method Thereof, U.S. Appl. No. 14/932,993, filed Nov. 5, 2015.
(Continued)

*Primary Examiner* — Peniel M Gumedzoe
*Assistant Examiner* — Christopher A Johnson
(74) *Attorney, Agent, or Firm* — Winston Hsu (57) ABSTRACT

A semiconductor device includes: a substrate; a gate structure on the substrate; and an epitaxial layer in the substrate adjacent to the gate structure, in which the epitaxial layer includes a planar surface and protrusions adjacent to two sides of the planar surface. Preferably, a contact plug is embedded in part of the epitaxial layer, and a silicide is disposed under the contact plug, in which a bottom surface of the silicide includes an arc.

7 Claims, 8 Drawing Sheets

(51) Int. Cl.
  *H01L 21/02* (2006.01)
  *H01L 21/28* (2006.01)
  *H01L 29/165* (2006.01)
  *H01L 23/535* (2006.01)
  *H01L 27/092* (2006.01)
  *H01L 29/417* (2006.01)
  *H01L 29/45* (2006.01)
  *H01L 29/66* (2006.01)
  H01L 29/08 (2006.01)

(52) U.S. Cl.
  CPC ...... *H01L 29/7848* (2013.01); *H01L 29/0847* (2013.01)

(56) References Cited

U.S. PATENT DOCUMENTS

2015/0091059 A1    4/2015  Hung et al.
2016/0093736 A1*   3/2016  Liang .................. H01L 29/7848
                                              257/384
2016/0163702 A1*   6/2016  Wu .................... H01L 27/0922
                                              257/369

OTHER PUBLICATIONS

Chun Wei Yu, Title of Invention: Method for Removing Silicon Nitride Material and Method for Fabricating Semiconductor Device, U.S. Appl. No. 14/881,626, filed Oct. 13, 2015.

* cited by examiner

SEMICONDUCTOR DEVICE HAVING EPITAXIAL LAYER WITH PLANAR SURFACE AND PROTRUSIONS

CROSS REFERENCE TO RELATED APPLICATIONS

This application is a division of U.S. application Ser. No. 15/003,782 filed Jan. 21, 2016, and incorporated herein by reference in its entirety.

BACKGROUND OF THE INVENTION

1. Field of the Invention

The invention relates to a method for fabricating semiconductor device, and more particularly, to a method of removing hard mask layer on a gate structure while forming a protective layer on the surface of a substrate.

2. Description of the Prior Art

In order to increase the carrier mobility of semiconductor structure, it has been widely used to apply tensile stress or compressive stress to a gate channel. For instance, if a compressive stress were to be applied, it has been common in the conventional art to use selective epitaxial growth (SEG) technique to form epitaxial structure such as silicon germanium (SiGe) epitaxial layer in a silicon substrate. As the lattice constant of the SiGe epitaxial layer is greater than the lattice constant of the silicon substrate thereby producing stress to the channel region of PMOS transistor, the carrier mobility is increased in the channel region and speed of MOS transistor is improved accordingly. Conversely, silicon carbide (SiC) epitaxial layer could be formed in silicon substrate to produce tensile stress for gate channel of NMOS transistor.

Conventionally, etching process is conducted to remove hard mask from the gate structure during the formation of epitaxial layer, and then contact plugs are formed thereafter. However, etchant used during the etching process often damages the surface of epitaxial layer and affects the performance of the device. Hence, how to improve the current fabrication to resolve this issue has become an important task in this field.

SUMMARY OF THE INVENTION

According to a preferred embodiment of the present invention, a method for fabricating semiconductor device is disclosed. The method includes the steps of: providing a substrate; forming a first gate structure on the substrate and a first spacer adjacent to the first gate structure; forming a first epitaxial layer in the substrate adjacent to the first gate structure; forming a first hard mask layer on the first gate structure; removing part of the first hard mask layer to form a protective layer on the first epitaxial layer; and removing the remaining first hard mask layer.

According to another aspect of the present invention, a semiconductor device is disclosed. The semiconductor device includes: a substrate; a gate structure on the substrate; and an epitaxial layer in the substrate adjacent to the gate structure, in which the epitaxial layer comprises a planar surface and protrusions adjacent to two sides of the planar surface.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
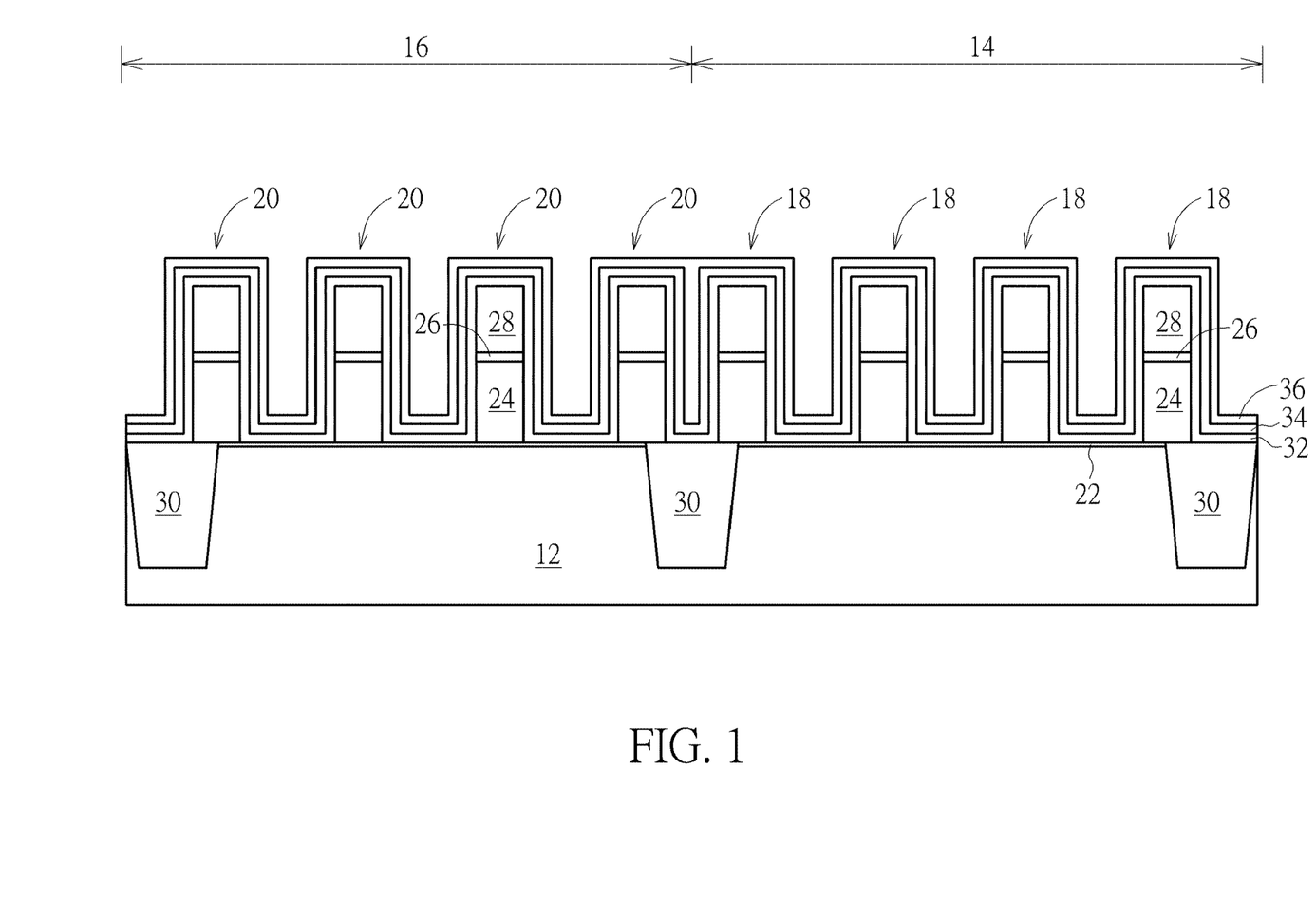
FIGS. 1-10 illustrate a method for fabricating semiconductor device according to a preferred embodiment of the present invention.

Referring to FIGS. 1-10, FIGS. 1-10 illustrate a method for fabricating semiconductor device according to a preferred embodiment of the present invention. As shown in FIG. 1, a substrate 12 is provided, and a first region 14 and a second region 16 are defined on the substrate 12, in which the first region 14 in this embodiment is preferably a NMOS region and the second region 16 is a PMOS region.

Next, gate structures 18 are formed on the first region 14 and gate structures 20 are formed on the second region 16. In this embodiment, the formation of the gate structures 18, 20 could be accomplished by sequentially forming a gate dielectric layer 22, a gate material layer, a first hard mask, and a second hard mask on the substrate 12, conducting a pattern transfer process by using a patterned resist (not shown) as mask to remove part of the second hard mask, part of the first hard mask, and part of the gate material layer through single or multiple etching processes, and stripping the patterned resist. This forms gate structures 18, 20 composed of patterned material layer 24, patterned hard mask 26, and patterned hard mask 28 on the first region 14 and second region 16 respectively. It should be noted that the quantity of the gate structures 18, 20 on first region 14 and second region 16 is not limited to the ones disclosed in this embodiment.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 22 could include $SiO_2$, SiN, or high-k dielectric material; the gate material layer 24 could include metal, polysilicon, or silicide; the hard mask 26 is preferably composed of silicon nitride; and the hard mask 28 is preferably composed of silicon oxide. It should be noted that even though the hard mask 28 composed of silicon oxide is disposed on top of the hard mask 26 composed of silicon nitride, the material of the hard masks 28 and 26 is not limited to the ones disclosed in this embodiment. For instance, the material of hard masks 26 and 28 could be selected from the group consisting of $SiO_2$, SiN, SiC, and SiON while the hard masks 26 and 28 are composed of different material.

In addition, a plurality of shallow trench isolations (STIs) 30 is formed in the substrate 12. Despite the present invention pertains to a planar MOS transistor, it would also be desirable to apply the process of the present invention to non-planar transistors, such as FinFET devices, and in such instance, the substrate 12 shown in FIG. 1 would become a fin-shaped structure formed atop a substrate 12.

Next, a hard mask 32, a hard mask 34, and a hard mask layer 36 are deposited on the substrate 12 to cover the gate structures 18, 20 on first region 14 and second region 16, in which the hard mask 32 is preferably composed of SiOCN, the hard mask 34 is composed of even thicker SiOCN, and the hard mask layer 36 is composed of SiN. In this embodiment, the thickness of the hard mask 34 is between twice to three times the thickness of the hard mask 32, but not limited thereto.

Figure 2:
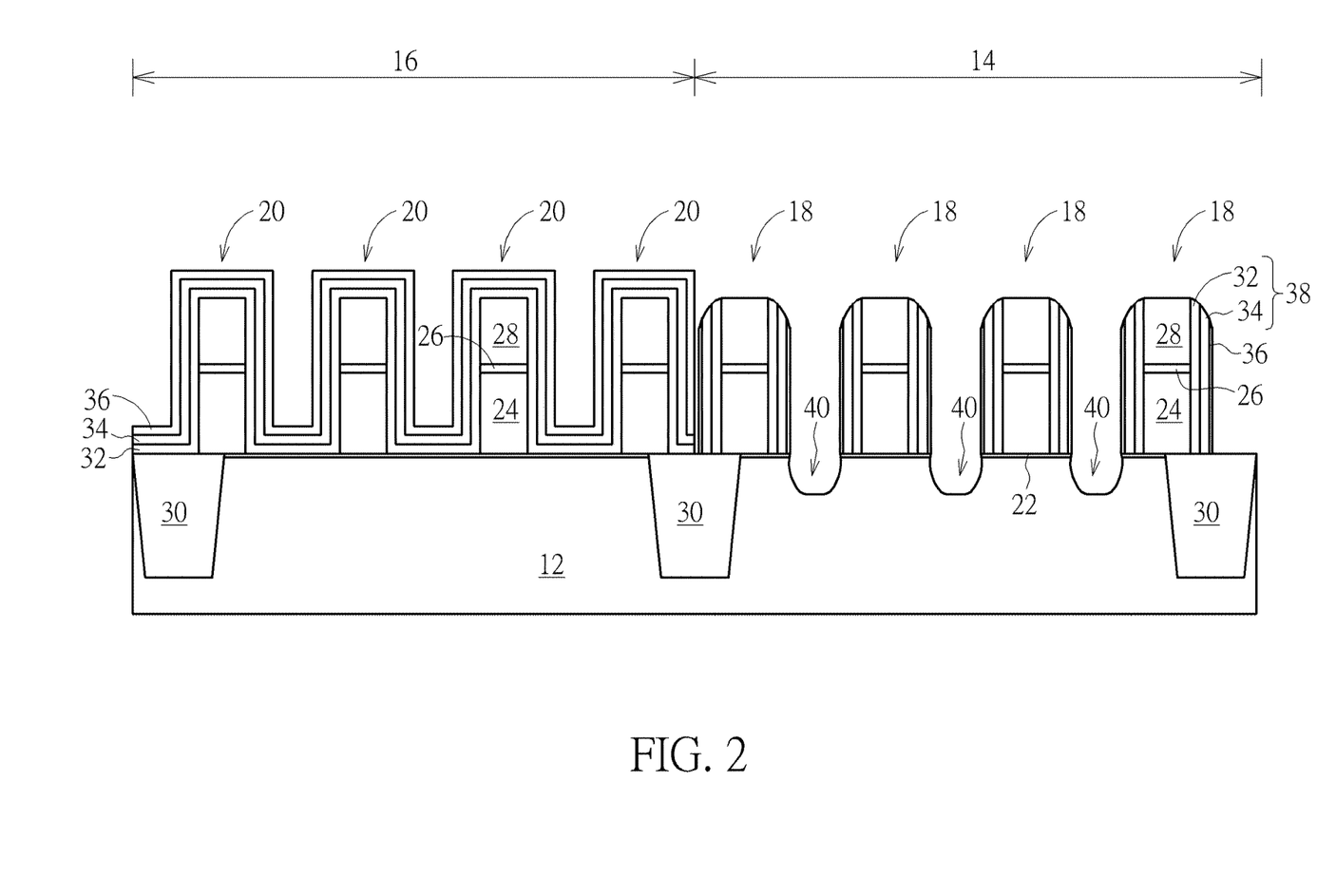

Next, as shown in FIG. 2, a patterned mask, such as a patterned resist (not shown) is formed on the second region 16, and an etching process is conducted by using the patterned resist as mask to remove part of the hard mask layer 36, part of the hard mask 34, and part of the hard mask 32 on first region 14 for forming spacers 38 and recesses 40 adjacent to the gate structures 18. The patterned resist is stripped thereafter. It should be noted that the part of the hard mask 32 and part of the hard mask 34 on first region 14 are removed during the etching process to form spacers 38, and a major portion of the hard mask layer 36 is removed during the formation of the recesses 40 while a small portion of the hard mask layer 36 is remained on the sidewalls of the spacers 38.

Figure 3:
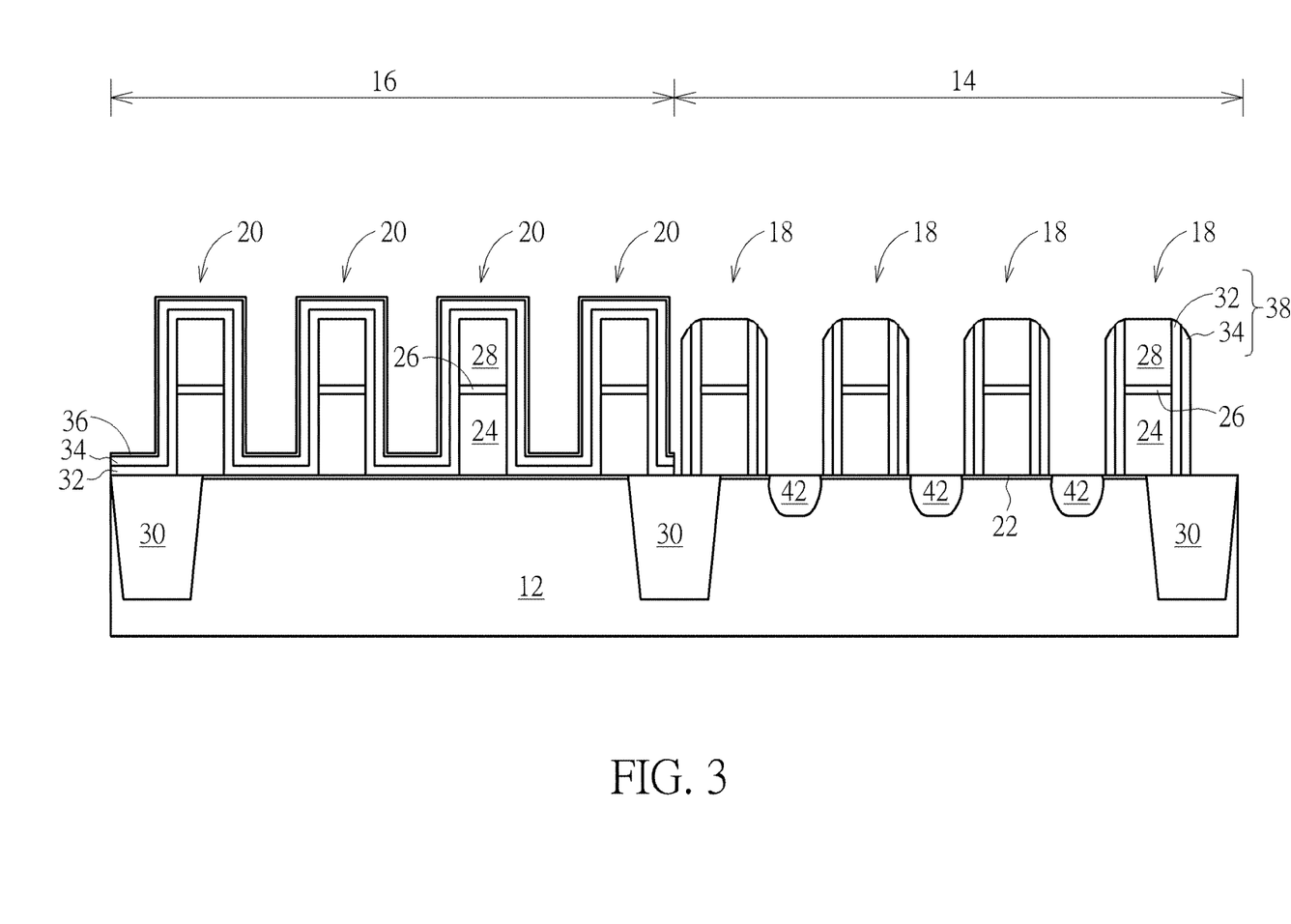

Next, as shown in FIG. 3, a cleaning process is selectively conducted to completely remove the remaining hard mask layer 36 on the sidewalls of spacers 38 and impurities in the recesses 40, and an epitaxial growth process is conducted to form epitaxial layers 42 in the recesses 40 on first region 14 for serving as source/drain regions. In this embodiment, the epitaxial layer is preferably composed of silicon phosphide (SiP).

Figure 4:
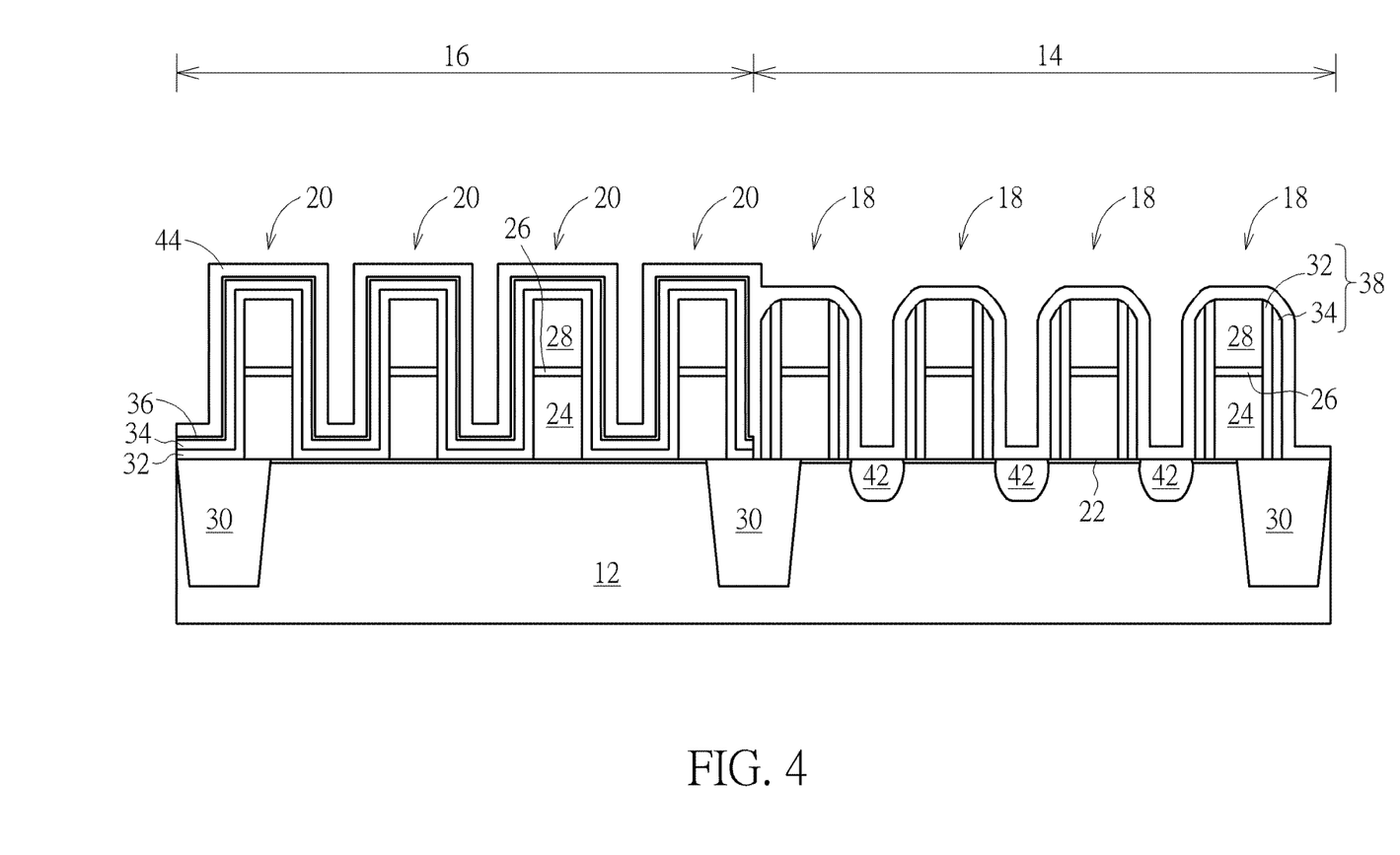

Next, as shown in FIG. 4, another hard mask layer 44 is formed on the first region 14 and second region 16 to cover the gate structures 18 and epitaxial layers 42 on first region 14 and the hard mask layer 36 on second region 16. In this embodiment, the hard mask layer 44 is preferably composed of silicon nitride, but not limited thereto.

Figure 5:
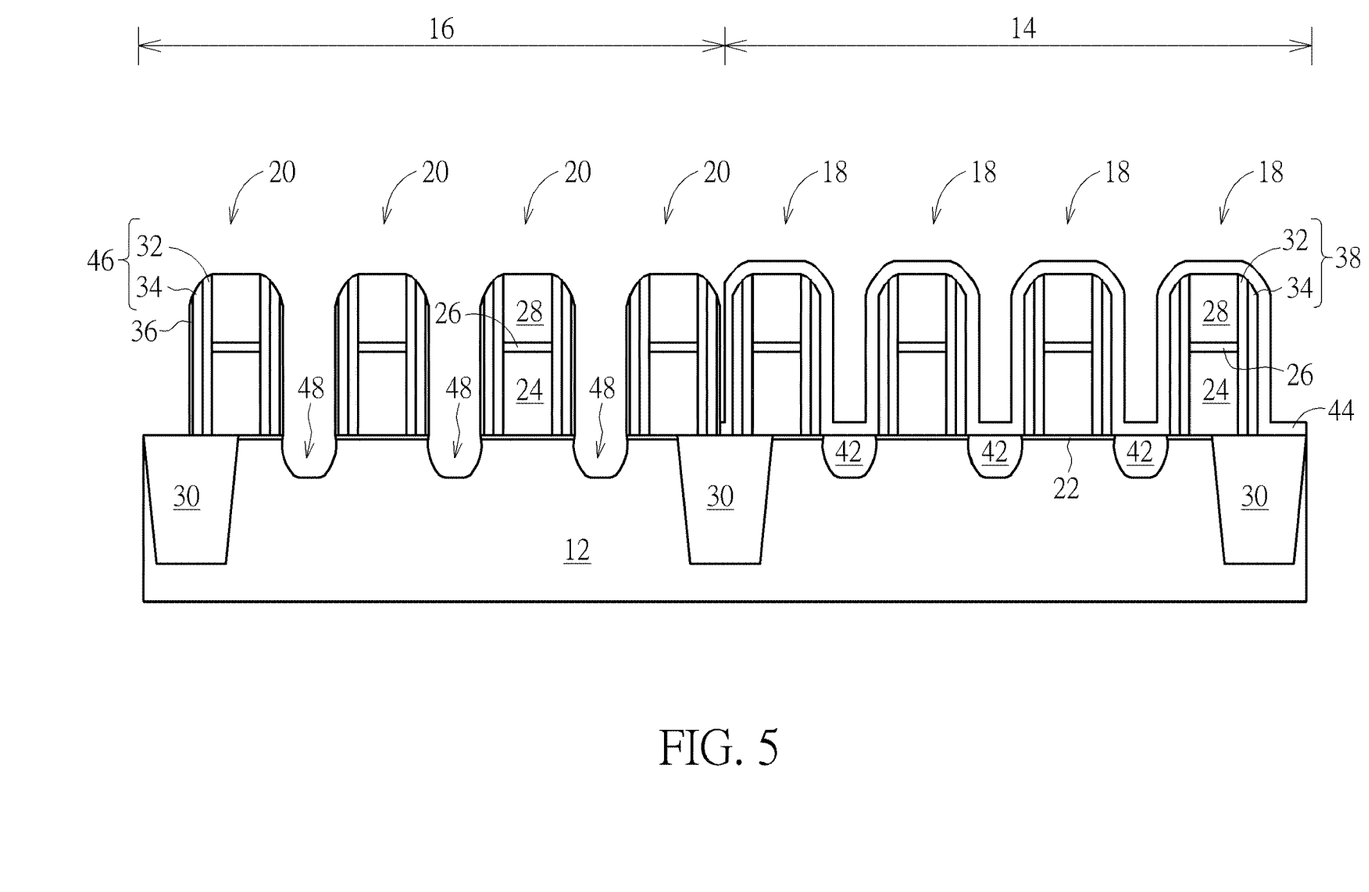

Next, as shown in FIG. 5, a patterned mask, such as a patterned resist (not shown) is formed on the first region 14, and an etching process is conducted by using the patterned resist as mask to remove the hard mask layer 44, part of the hard mask layer 36, part of the hard mask 34, and part of the hard mask 32 on second region 16 for forming spacers 46 and recesses 48 adjacent to the gate structures 20. It should be noted that the hard mask layer 44 on second region 16 is preferably removed completely during the etching process, the hard mask 32 and hard mask 34 are partially removed during the etching process to form spacers 46, and a major portion of the hard mask layer 36 is removed during the formation of the recesses 48 while a small portion of the hard mask layer 36 is remained on the sidewalls of spacers 46.

Figure 6:
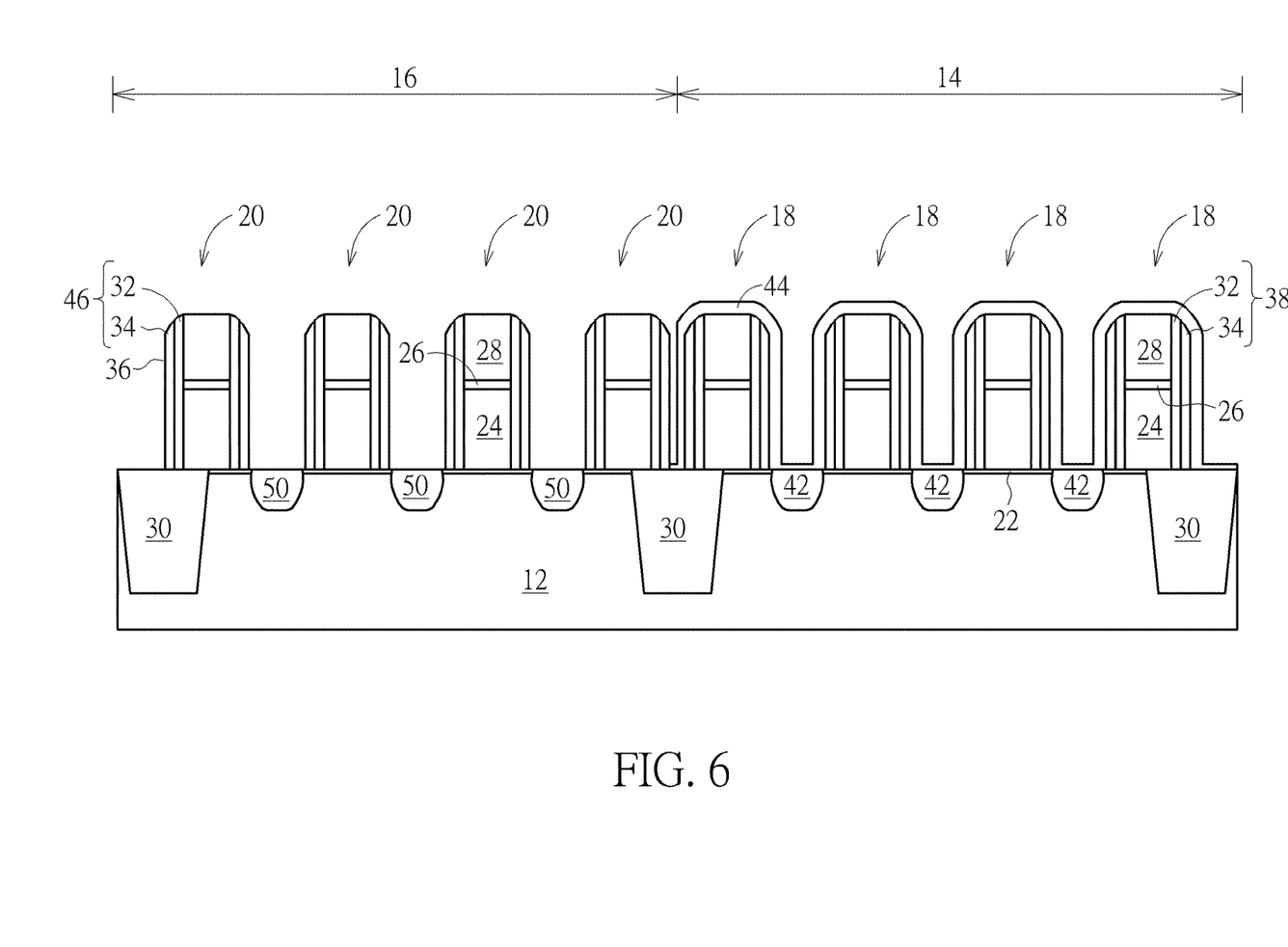

Next, as shown in FIG. 6, a selective cleaning process is conducted to completely remove the remaining hard mask layer 36 on the sidewalls of the spacers 46, impurities in the recesses 48, and part of the hard mask layer 44 on the first region 14 so that the remaining hard mask layer 44 is still disposed on the top and sidewalls of each gate structure 18 as well as on the top surface of the epitaxial layers 42. Next, an epitaxial layer 50 is formed in each recess 48 to serve as source/drain region on the second region 16, in which the epitaxial layer 50 is preferably composed of silicon germanium (SiGe).

It should be noted the hard mask layer 44 remained on the sidewalls of gate structures 18 and the hard mask layer 44 remained on the epitaxial layer 42 surface after the aforementioned cleaning process typically have different thickness. In this embodiment, the thickness of the hard mask layer 44 remained directly on top of each gate structure 18 or the hard mask layer 44 remained on a sidewall of each gate structure 18 is about twice the thickness of the hard mask layer 44 remained on the epitaxial layer 42 surface. For instance, the thickness of the hard mask layer 44 remained directly on top of each gate structure 18 or the thickness of the hard mask layer 44 remained on a sidewall of the gate structure 18 is approximately 40 Angstroms while the thickness of the hard mask layer 44 remained on the epitaxial layer 42 surface if about 20 Angstroms.

Referring to FIGS. 7-10, FIGS. 7-10 illustrate a method of using cleaning process to remove the hard mask layer 44 on first region 14 and forming a contact plug 72. It should be noted that in order to emphasize the steps of removing hard mask layer 44 on first region 14 (or NMOS region) and forming contact plug 72, only part of the gate structure 18 and epitaxial layer 42 and a single contact plug 72 connecting the epitaxial layer 42 on first region 14 is revealed in FIGS. 7-10.

Figure 7:
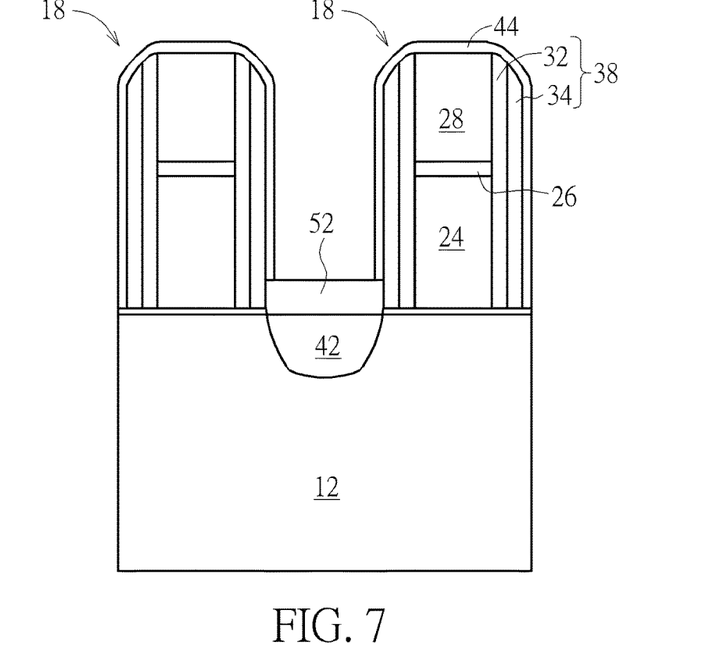

As shown in FIG. 7, a patterned mask (not shown) could be selectively formed on the second region 16, and a first cleaning process is conducted to remove part of the hard mask layer 44 on sidewalls of the gate structures 18 and the hard mask layer 44 on epitaxial layer 42 while forming a protective layer 52 on the epitaxial layer 42. Preferably, the protective layer 52 is composed of silicon oxide and a cleaning agent used in the first cleaning process is selected from the group consisting of diluted hydrofluoric acid (dHF), phosphoric acid ($H_3PO_4$), and SC1, in which SC1 being a standard cleaning solution preferably containing elements selected from the group consisting of $NH_4OH$ and $H_2O_2$.

Specifically, dHF from the cleaning agent is used to remove native oxides remained on the epitaxial layer 42 surface, phosphoric acid is used to remove the hard mask layer 44 composed of SiN, and the standard cleaning solution SC1 is used to form protective layer 52 composed of silicon oxide. Viewing from a much more detailed perspective, the aforementioned first cleaning process first removes the entire hard mask layer 44 on epitaxial layer 42 surface and part of the hard mask layer 44 on sidewalls of the gate structures 18 and adjacent to two sides of the epitaxial layer 42, and then forms a protective layer 52 on the exposed epitaxial layer 42 surface.

In this embodiment, the duration of the dHF is approximately 15 seconds, the temperature of the phosphoric acid is preferably between 150° C. to 190° C. or most preferably at 161° C., the duration of the phosphoric acid is preferably less than 60 seconds or most preferably less than 30 seconds, the temperature of standard cleaning solution SC1 is between 25° C. to 60° C., or most preferably at 25° C., and the duration of SC1 is preferably less than 120 seconds or most preferably 90 seconds.

Figure 8:
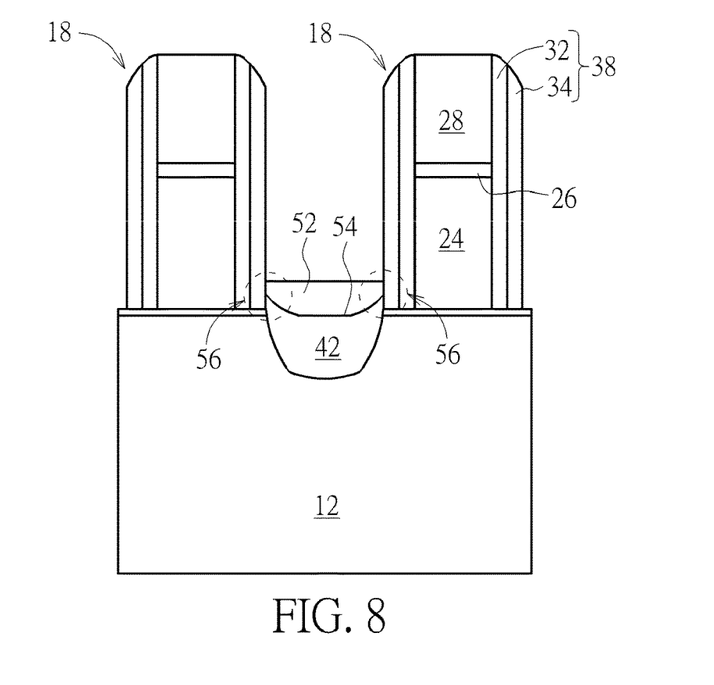

Next, as shown in FIG. 8, a second cleaning process is conducted to remove the remaining hard mask layer 44 on gate structures 18 to expose the spacers 38, in which the cleaning agent used in the second cleaning process is selected from the group consisting of phosphoric acid and SC1.

Specifically, phosphoric acid from the cleaning agent in the second cleaning process is used to remove all of the remaining hard mask layer 44 on the gate structures 18, including all the hard mask layer 44 remained on the top and sidewalls of the gate structures 18. Through the protection of the protective layer 52, no damage would be done on the surface of epitaxial layer 42 by the cleaning agent during the cleaning process, and even if part of the protective layer 52 is lost, additional protective layer 52 could be formed again by the standard cleaning solution SC1. In other words, the protective layer 52 is remained still on the surface of epitaxial layer 42 as the hard mask layer 44 is removed by the aforementioned cleaning agent, and even after the hard mask layer 44 is totally removed, part of the protective layer 52 could still remain on the epitaxial layer 42 surface, or could be removed completely, which are all within the scope of the present invention.

It should be noted that after the aforementioned two cleaning processes are completed, the surface profile of the epitaxial layer 42 is slightly altered according to a preferred embodiment of the present invention. For instance, as shown in FIG. 8, the epitaxial layer 42 after the treatment preferably includes a planar surface 54 and protrusions 56 adjacent to two sides of the planar surface 54.

Figure 9:
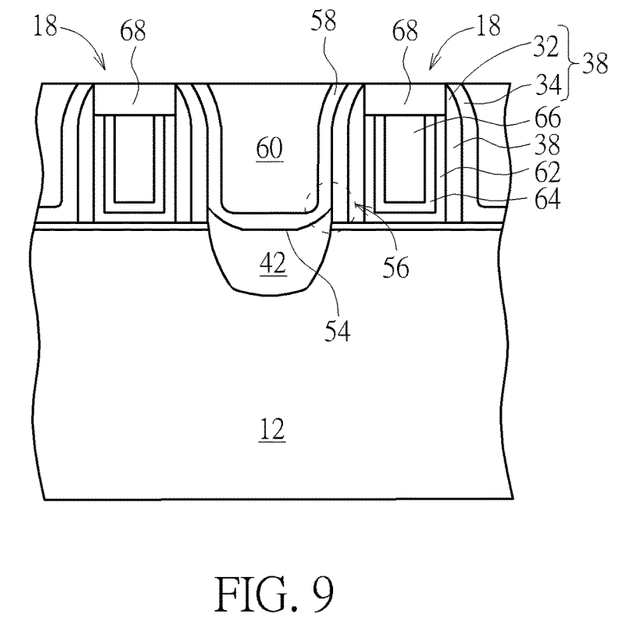

Next, as shown in FIG. 9, the remaining protective layer 52 if any could be selectively removed, a contact etch stop layer (CESL) 58 composed of silicon nitride could be selectively formed on the substrate 12 to cover the gate structures 18, and an interlayer dielectric (ILD) layer 60 is formed on the CESL 58. Next, a planarizing process, such as a chemical mechanical polishing (CMP) process is conducted to remove part of the ILD layer 60, part of the CESL 58, the hard masks 28, and the hard masks 26 to expose the gate material layer 24 composed of polysilicon material so that the top surface of the gate material layer 24 is even with the top surface of the ILD layer 60.

Next, a replacement metal gate (RMG) process is conducted to transform the gate structures 18, 20 on first region 14 and second region 16 into metal gates. The RMG process could be accomplished by first performing a selective dry etching or wet etching process, such as using etchants including ammonium hydroxide ($NH_4OH$) or tetramethylammonium hydroxide (TMAH) to remove the gate material layer 24 from gate structures 18, 20 for forming recesses (not shown) in the ILD layer 60. Next, a high-k dielectric layer 62 and a conductive layer including at least a U-shaped work function metal layer 64 and a low resistance metal layer 66 are formed in the recesses, and a planarizing process is conducted so that the surfaces of the U-shaped high-k dielectric layer 62, U-shaped work function metal layer 64, low resistance metal layer 66, and ILD layer 60 are coplanar.

In this embodiment, the high-k dielectric layer 62 is preferably selected from dielectric materials having dielectric constant (k value) larger than 4. For instance, the high-k dielectric layer 62 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 64 is formed for tuning the work function of the later formed metal gates to be appropriate in an NMOS or a PMOS. For an NMOS transistor, the work function metal layer 64 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 64 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 64 and the low resistance metal layer 66, in which the material of the barrier layer may include titanium (Ti), titanium nitride (TiN), tantalum (Ta) or tantalum nitride (TaN). Furthermore, the material of the low-resistance metal layer 66 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity. Next, part of the high-k dielectric layer 62, part of the work function metal layer 64, and part of the low resistance metal layer 66 are removed to form a recess (not shown), and a hard mask 68 is formed in the recess so that the top surfaces of the hard mask 68 and ILD layer 60 are coplanar. The hard mask 68 could be selected from the group consisting of silicon oxide, silicon nitride, silicon oxynitride, and silicon carbon nitride.

Figure 10:
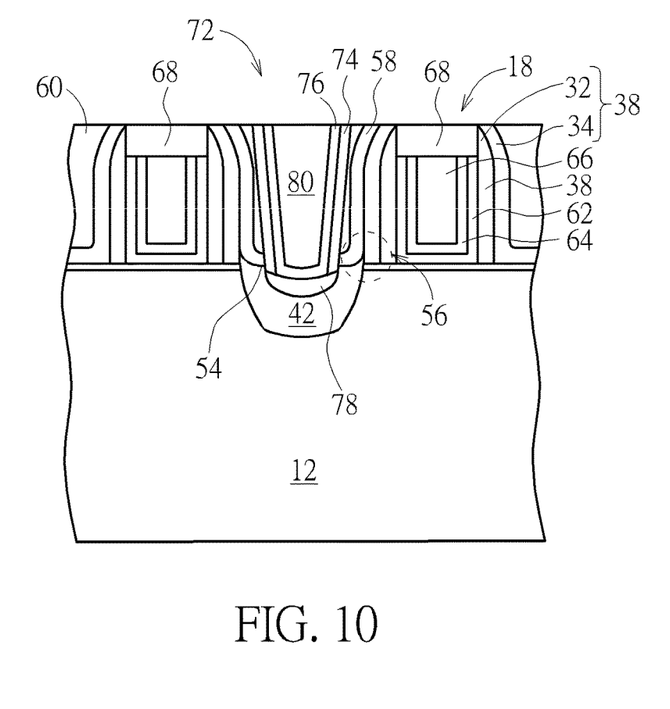

Next, as shown in FIG. 10, a contact plug formation is conducted with silicide process to form a silicide on the epitaxial layer 42 surface and a contact plug 72 electrically connected to the source/drain region and epitaxial layer 42 adjacent to two sides of the gate structures 18. In this embodiment, the contact plug formation could be accomplished by first conducting an etching process to remove part of the ILD layer 60 between gate structures 18 to form a contact hole (not shown) exposing the epitaxial layer 42 surface. Next, a first metal layer 74 and a second metal layer 76 are deposited in sequence in the contact hole, in which the first metal layer 74 and the second metal layer 76 are formed conformally on the surface of the epitaxial layer 42 and inner sidewalls of the contact hole. In this embodiment, the first metal layer 74 is selected from the group consisting of Ti, Co, Ni, and Pt, and most preferably Ti, and the second metal layer 76 is selected from the group consisting of TiN and TaN.

After depositing the first metal layer 74 and second metal layer 76, a first thermal treatment process and a second thermal treatment process are conducted sequentially to form a silicide 78 on the epitaxial layer 42. In this embodiment, the first thermal treatment process includes a soak anneal process, in which the temperature of the first thermal treatment process is preferably between 500° C. to 600° C., and most preferably at 550° C., and the duration of the first thermal treatment process is preferably between 10 seconds to 60 seconds, and most preferably at 30 seconds. The second thermal treatment process includes a spike anneal process, in which the temperature of the second thermal treatment process is preferably between 600° C. to 950° C., and most preferably at 600° C., and the duration of the second thermal treatment process is preferably between 100 milliseconds to 5 seconds, and most preferably at 5 seconds.

After the two thermal treatment processes are conducted, a third metal layer 80 is deposited to fully fill the contact hole. In this embodiment, the third metal layer 80 is composed of tungsten, but not limited thereto. Next, a planarizing process, such as a CMP process is conducted to remove part of the third metal layer 80, part of the second metal layer 76, and part of the first metal layer 74, and depending on the demand of the process also removing part of the ILD layer 60 for forming a contact plug 72 electrically connected to the epitaxial layer 42. This completes the fabrication of a semiconductor device according to a preferred embodiment of the present invention.

Referring again to FIG. 10, which further illustrates a structural view of a semiconductor device according to a preferred embodiment of the present invention. As shown in FIG. 10, the semiconductor device includes at least a gate structure 18 on the substrate 12, an epitaxial layer 42 in the substrate 12 adjacent to two sides of the gate structures 18, a contact plug 72 embedded in part of the epitaxial layer 42 and a silicide 78 disposed under the bottom of the contact plug 72. Specifically, the epitaxial layer 42 includes a planar surface 54 and protrusions 56 adjacent to two sides of the planar surface 54, a bottom surface of the contact plug 72 has an arc profile or curved surface, and a bottom surface of the silicide 78, such as the bottom surface contacting the epitaxial layer 42 also has an arc or curved surface.

Overall, the present invention preferably conducts two cleaning processes after an epitaxial layer is formed adjacent to two sides of a gate structure, in which the first cleaning process removes part of the hard mask layer on sidewalls of the gate structure while forming a protective layer on the epitaxial layer surface and the second cleaning process removes the remaining hard mask layer on the gate structure completely. According to a preferred embodiment of the present invention, it would be desirable to use the protective layer to prevent cleaning agent from damaging the epitaxial layer underneath during the second cleaning process thereby ensuring the operation and performance of the device. It should also be noted that even though the two cleaning processes of the present invention were applied to NMOS transistors in the aforementioned embodiments, it would also be desirable to apply the same cleaning processes to transistors on PMOS region and in such instance, the transistors on PMOS region would also demonstrate epitaxial layer structure with similar planar surface and protrusions, which is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate;
   a gate structure on the substrate;
   a spacer adjacent to the gate structure;
   a contact plug adjacent to the gate structure; and
   an epitaxial layer adjacent to the gate structure and under the contact plug, wherein the epitaxial layer comprises a planar surface and a protrusion, both the planar surface and the protrusion are adjacent to two sides of the contact plug, all of the planar surface is higher than a top surface of the substrate, and a tip of the protrusion is higher than the planar surface and contacting a sidewall of the spacer directly.

2. The semiconductor device of claim 1, further comprising the contact plug embedded in part of the epitaxial layer, wherein a bottom surface of the contact plug comprises an arc.

3. The semiconductor device of claim 2, further comprising a silicide under the contact plug.

4. The semiconductor device of claim 3, wherein a bottom surface of the silicide comprises an arc.

5. The semiconductor device of claim 4, wherein the epitaxial layer comprises silicon phosphide.

6. The semiconductor device of claim 1, further comprising a contact etch stop layer (CESL) adjacent to the gate structure, wherein the protrusion contacts the CESL directly.

7. The semiconductor device of claim 1, wherein a tip of the protrusion is higher than a top surface of the substrate.

* * * * *